US 6,661,818 B1

(12) United States Patent
Feldman et al.

(10) Patent No.: US 6,661,818 B1
(45) Date of Patent: Dec. 9, 2003

(54) ETALON, A WAVELENGTH MONITOR/ LOCKER USING THE ETALON AND ASSOCIATED METHODS

(75) Inventors: Michael R. Feldman, Charlotte, NC (US); Hongtao Han, Mooresville, NC (US); John Barnett Hammond, Charlotte, NC (US)

(73) Assignee: Digital Optics Corporation, Charlotte, NC (US)

( * ) Notice: Subject to any disclaimer, the term of this patent is extended or adjusted under 35 U.S.C. 154(b) by 0 days.

(21) Appl. No.: 09/543,760

(22) Filed: Apr. 5, 2000

(51) Int. Cl.[7] .............................. H01S 3/10; H01S 3/13; H01S 3/081; H01S 3/08
(52) U.S. Cl. .............................. 372/32; 372/23; 372/25; 372/93; 372/99
(58) Field of Search .............................. 372/32, 19, 23, 372/25, 50, 93, 99, 101, 105, 705; 359/247

(56) References Cited

U.S. PATENT DOCUMENTS

| 5,428,700 | A | | 6/1995 | Hall .............................. 372/32 |
| 5,666,225 | A | | 9/1997 | Colbourne |
| 5,784,507 | A | | 7/1998 | Holm-Kennedy et al. .... 385/31 |
| 5,798,859 | A | * | 8/1998 | Colbourne et al. ......... 359/247 |
| 5,825,792 | A | | 10/1998 | Villenueve et al. ........... 372/32 |
| 5,828,689 | A | | 10/1998 | Epworth ..................... 372/98 |
| 6,005,995 | A | | 12/1999 | Chen et al. .................... 385/24 |
| 6,345,060 | B1 | * | 2/2002 | Copner et al. ................. 372/32 |
| 2002/0041562 | A1 | * | 4/2002 | Redmond et al. ...... 369/112.19 |

FOREIGN PATENT DOCUMENTS

| EP | 0 875 743 A1 | 2/1997 |
| EP | 0 911 621 A2 | 3/1998 |
| WO | WO 97/05679 | 2/1997 |
| WO | WO 99/04466 | 1/1999 |
| WO | WO 99/18612 | 4/1999 |

* cited by examiner

Primary Examiner—Paul Ip
Assistant Examiner—Armando Rodriguez
(74) Attorney, Agent, or Firm—Susan S. Morse

(57) ABSTRACT

An etalon used in analyzing a wavelength of a light source includes ant etalon only in a portion of a substrate in which the etalon is integrated. Use of such an etalon in monitoring or controlling the wavelength allows the etalon to be placed in an application beam. A portion of the application beam is split into at least two beams, a first beam being directed to the etalon to monitor the wavelength, and the other beam either serving purely as a reference beam or passing through another etalon having a different optical path length than the etalon for the first beam, thereby also monitoring the wavelength. The monitor itself would include at least two photodetector, one for each of the beam split off of the input beam. Any or all substrates containing the elements for the monitor may be created on a wafer level and diced and/or bonded to other wafers containing other elements and diced.

28 Claims, 4 Drawing Sheets

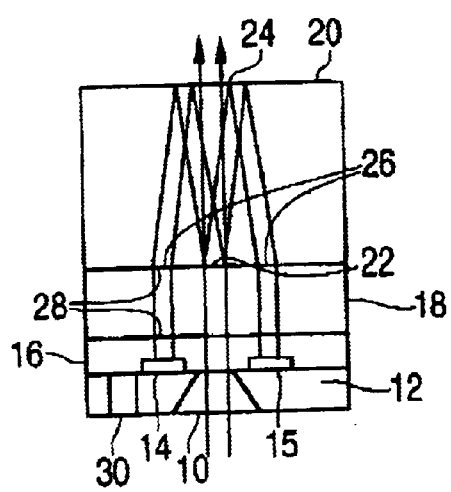
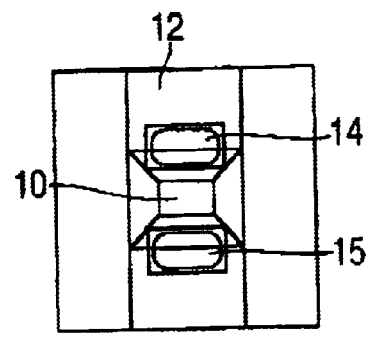
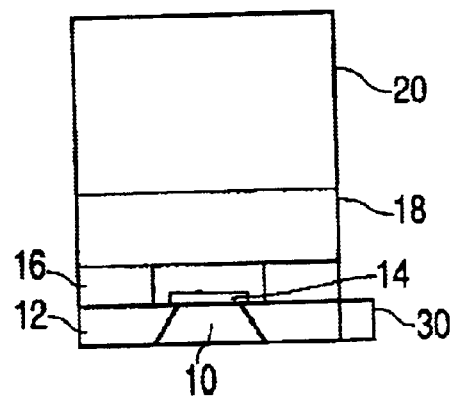
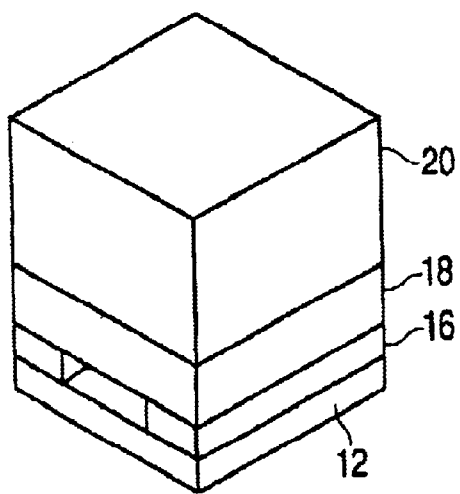
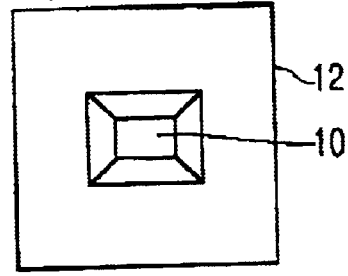

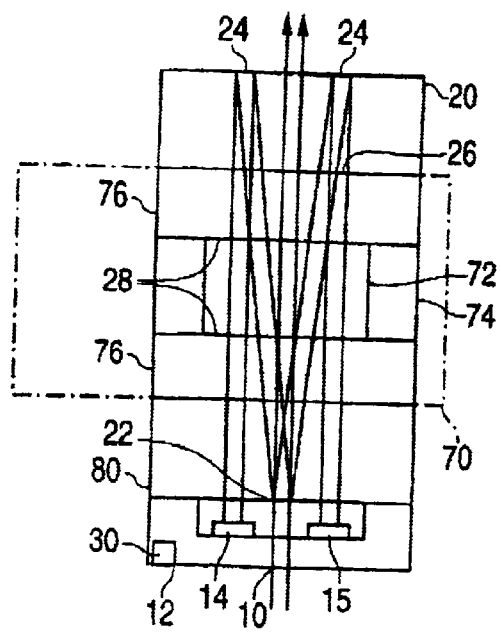
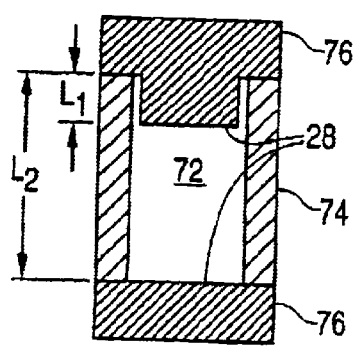
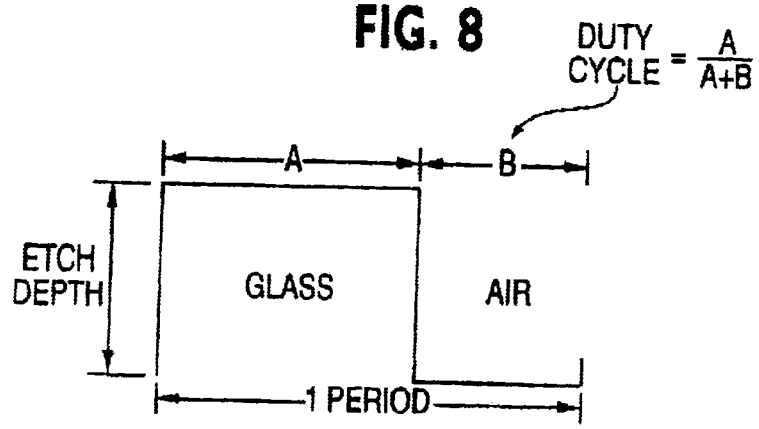

ETALON, A WAVELENGTH MONITOR/LOCKER USING THE ETALON AND ASSOCIATED METHODS

CROSS-REFERENCES TO RELATED APPLICATIONS

The present application claims priority under 35 U.S.C. §119 to U.S. Provisional Application No. filed on Feb. 4, 2000, the entire contents of which are hereby incorporated by reference for all purposes.

BACKGROUND OF THE INVENTION

1. Field of the Invention

The present invention is directed to an etalon, a wavelength monitor/locker using the etalon, more particularly to an integrated wavelength locker which can be placed in an optical path of an application beam or in an optical path of a monitor beam.

2. Description of Related Art

Some radiation sources exhibit wavelength drift over time in excess of that tolerable for many applications. For many applications, the wavelength stability is required to be within 0.05 nm from a desired wavelength. This drift becomes increasingly important as the lifetimes over which these radiation sources are to be deployed increases. Factors such as temperature, age, operating power level, etc., all effect the output wavelength. By monitoring at least one of the direction of the wavelength change, the degree of the change and the percentage of the light being radiated at the different wavelengths, any or all factors which may be causing this change can be modified in accordance with the monitored signal via a feedback loop to stabilize the wavelength of the radiation source. Preferably, both the power and the wavelength are monitored. The wavelength may be controlled by altering a temperature of the light source, e.g., by a thermally cooled unit, and the power may be controlled in accordance with the injection current. Since the power and the wavelength are interdependent, i.e., a change in one parameter affects the other, the best stability is achieved when both are controlled.

Such monitoring and stabilizing systems typically involve using a unit which is external to the radiation source itself. Such external units include crystal gratings, fiber gratings, spectrometers, and Fabry-Perot etalons, both straight and inclined. The grating systems include relatively large control units external to the radiation source. While etalon-based systems offer a more compact solution, so far these etalons are still separate units which may become improperly aligned, either with photodetectors or with optical elements required to direct and control the light onto the photodetectors.

SUMMARY OF THE INVENTION

The present invention is therefore directed to an etalon and a wavelength monitor/locker which substantially overcomes one or more of the problems due to the limitations and disadvantages of the related art.

At least one of these and other objectives may be realized by providing a wavelength locker including a divider creating at least a first beam and a second beam from an input beam from a light source, a first photodetector receiving the first beam, a second photodetector receiving the second beam, a substrate including an etalon in a path between the divider and the first photodetector, and another element performing an optical function, and a connector supplying outputs of the monitor photodetector and the reference photodetector to a wavelength controller of the light source.

The divider may include a diffractive grating for deflecting a portion of the input beam into higher orders. The diffractive grating may be polarization insensitive.

The wavelength locker may include an optics block which directs the first and second beams to the first photodiode and the second photodiode, respectively. The divider may be integrated on the optics block. The optics block may provide at least one of collimating and focusing to at least one of the input beam, the first beam and the second beam.

At least two of the etalon, the divider and the optics block may be bonded together on a wafer level and diced to form that portion of the wavelength locker.

The first photodetector and the second photodetector may be mounted on a substrate. The substrate may have a hole therein between the first photodetector and the second photodetector. The substrate may have a transparent region therein between the first photodetector and the second photodetector. A spacer may be provided between the substrate and the etalon. The substrate may have a recess therein in which the first photodetector and the second photodetector are mounted. The another element performing an optical function may be at least one of a refractive element and a diffractive element. The optics block may reflect the first and second beams to the first photodetector and the second photodetector, respectively. The optics block provides multiple reflections to the first and second beams to direct them to the first photodetector and the second photodetector, respectively. The another element performing an optical function may be another etalon in a path between the divider and the second photodetector, the another etalon having a different path length than the etalon between the divider and the first photodetector. The another element performing an optical function may be the divider.

The etalon may be solid or have a gap between opposing reflective portions thereof. The divider may output a third beam as an application beam to be directed to further applications.

The above and other objects may be realized by providing a method of designing a polarization insensitive grating including starting with a design of a grating providing a desired ratio of diffracted light to undiffracted light for unpolarized light, first varying one of an etch depth and a duty cycle until the desired ratio is realized for light of a first polarization, second varying another of the etch depth and duty cycle until the desired ratio is realized for light of a second polarization, orthogonal to the first polarization, and performing the first and second varying until a ratio for the first polarization is in sufficient agreement with a ratio for the second polarization. The method first varying may alter the duty cycle and the second varying may alter the etch depth.

The above and other objects may be realized by providing a wavelength monitor including a first substrate being optically transparent and having first and second opposing faces, at least two photodetectors, an etalon in the path of at least one of the at least two photodetectors, the etalon and the first substrate being bonded together, wherein all elements needed to create at least two beams from an input beam, each of the at least two light beams being incident on a respective photodetector, and to direct each of the at least two beams to the respective photodetector, are on at least one of the first substrate and any structure bonded to at least one of the first substrate and the etalon.

The above and other objects may be realized by providing an etalon including a continuous substrate which is to extend across at least two photodetector, at least two opposing reflective portions on the substrate in a path of at least one of the at least two photodetectors, with at least one of the at least two photodetectors not having reflective portions in a path thereof. The continuous substrate may include two continuous substrates and a spacer bonded to the two continuous substrates, forming a gap between the two continuous substrates, the at least two opposing reflective portions being on opposing faces of the two continuous substrates. The at least two opposing reflective portions may be formed on continuous wafer which is diced to form the continuous substrate.

The above and other objects may be realized by providing an etalon block including a substrate having opposing reflective portions serving as an etalon in a portion thereof and another element performing another optical function. The etalon block may further include an optics block adjacent to the substrate, at least one of the optics block and the substrate including a divider for creating at least a first beam and a second beam from an input beam from a light source, the first beam passing through the etalon and at least one of the second beam and the input beam passing through the other optical element. The other optical element may be another etalon, separate from the etalon, the second beam passing through the another etalon, the another etalon having a different optical path length than the etalon. The other optical element may be a divider for creating at least a first beam and a second beam from an input beam from a light source.

These and other objects of the present invention will become more readily apparent from the detailed description given hereinafter. However, it should be understood that the detailed description and specific examples, while indicating the preferred embodiments of the invention, are given by way of illustration only, since various changes and modifications within the spirit and scope of the invention will become apparent to those skilled in the art from this detailed description.

BRIEF DESCRIPTION OF THE DRAWINGS

The foregoing and other objects, aspects and advantages will be described with reference to the drawings, in which:

FIG. 1A is a cross-sectional front view of an embodiment of the integrated wavelength locker of the present invention;

FIG. 1B is a transparent top view of the integrated wavelength locker of FIG. 1A;

FIG. 1C is a cross-sectional side view of the integrated wavelength locker of FIG. 1A;

FIG. 1D is a bottom view of the integrated wavelength locker of FIG. 1A;

FIG. 1E is an elevational perspective view of the integrated wavelength locker of FIG. 1A;

FIGS. 6A–6C are side view of different configurations of the wavelength locker of the present invention with no application beam passing through;

FIG. 7A is a cross-sectional front view of another embodiment of the integrated wavelength locker of the present invention;

FIG. 7B is a cross-sectional view of a thermally stable etalon in accordance with the present invention; and FIG. 8 is a schematic view of a polarization insensitive diffraction grating to be used in conjunction with any of the embodiments of the integrated wavelength locker.

DETAILED DESCRIPTION OF THE PREFERRED EMBODIMENTS

Figure 2:
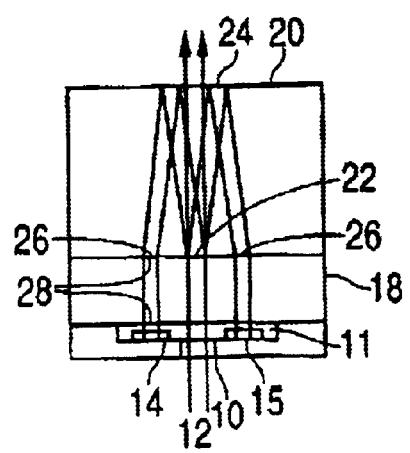
FIG. 2 is a cross-sectional front view of another embodiment of the integrated wavelength locker of the present invention.

FIGS. 1A–1E illustrate various views of a first embodiment of the integrated wavelength locker of the present invention. The integrated wavelength locker includes a substrate 12 for mounting photodetectors 14, 15. The substrate 12 also includes an aperture 10 therein between the photodetectors. An etalon block 18 includes opposing reflective portions 28, e.g., a reflective dielectric stack, on opposite surfaces thereof to form an etalon in the path of a first photodetector 14. The path of a second photodetector 15 does not include an etalon. A spacer 16 is provided between the photodetectors 14, 15 and the etalon block 18. An optics block 20 has a diffractive grating 22 on a bottom surface thereof and two reflective portions 24 on a top surface thereof. The optics block 20 may also include an optical element on the top and/or bottom surface thereof in the path of the straight through beam, e.g., for focusing and/or collimating the beam. Metallization pads 30 may be provided to supply electrical connection for the active elements and for the outputs of the photodetectors 14, 15 to be provided to a control system for controlling the light source being monitored.

As can be seen most clearly in FIG. 1A, light from a light source, e.g., a semiconductor laser or light emitting diode, passes through the aperture 10 in the substrate 12 on which the photodetectors 14, 15 are mounted. A small amount of the light is deflected by the diffraction grating 22, with most of the light being in the zero order, so it passes straight through the diffraction grating 22. The diffracted light then impinges upon the reflective portions 24 on the top surface of the optics block 20. The reflective portions 24 direct the light back toward optical elements 26, which deflect the light and direct it to the photodetectors 14, 15.

The opposing reflective portions 28 of the etalon block 18 are designed such that a predetermined transmission therethrough occurs at the desired output wavelength of the light source. The reflective portions 28 are parallel to one another and the etalon has a thickness d and an index of refraction n. The phase delay $\delta$ is given by the following:

$$\delta = 4\pi n d \cos\theta / \lambda \tag{1}$$

where $\theta$ is the angle of incidence internal to the etalon and $\lambda$ is the wavelength. The maximum transmission thus occurs when the phase delay $\delta$ is an integer multiple of $2\pi$. For a given refractive index, incidence angle, and desired wavelength, the thickness of the etalon may be determined to provide any desired value of the phase delay. This phase delay in turn will determine the amount of transmittance at the desired wavelength. The transmittance is the ratio of the reflected irradiance $I_r$ to the incident irradiance $I_i$, which is given by:

$$\frac{I_r}{I_i} = \frac{1}{1 + [4R/(1-R)]^2 \sin^2(\delta/2)} \tag{2}$$

where R is the reflectivity of the etalon and $\delta$ is determined from equation (1). Deviation from this desired transmittance indicates drifting away from the desired wavelength, and is to be corrected.

In the particular embodiment shown in FIGS. 1A–1E, the amount of light received by the first photodetector 14 is compared to the amount of light received on the second photodetector 15 in order to insure any change in the amount of light on the first photodetector 14 is due to a shift in wavelength, rather than some power fluctuation in the light source output. The outputs of the first photodetector 14 and the second photodetector 15 are fed to a system to determine any shift in wavelength and to control the wavelength output by the light source in accordance with this shift. Such a control system may include altering the temperature of the light source, e.g., by controlling a thermoelectric cooler on which the light source is mounted, altering an injection current, and/or altering a length of an external cavity, such as a microelectronic mechanical device, as known in the art. The control system may alter the parameters of the light source by a predetermined amount or by an amount in accordance with the degree of shift indicated by the photodetectors.

The predetermined transmission of the etalon formed by the reflective portions 28 is given by may be at any desired position on the response curve of the etalon. For example, the etalon formed by the reflective portions 28 may be designed to provide a maximum transmission, e.g., 100%, at the desired wavelength. While providing the maximum transmission at the desired wavelength allows the difference in transmission arising from any shift in wavelength to be readily detected, the direction of this wavelength shift will not be known, since an identical shift in either direction will result in the same change in transmission. Therefore, the shift is assumed to be in a particular direction. If the resulting change leads to a further decrease in transmission, the shift was actually in the opposite direction and the control of the light source will be adapted accordingly. Of course, the analogous logic would apply if the etalon formed by the reflective portions 28 was designed to provide a minimum transmission at the desired wavelength.

Alternatively, the etalon formed by the reflective portions 28 may be designed to provide transmission at an inflection point, e.g., the average transmission, of the response curve. At an inflection point, the direction of the transmission change will indicate the direction of the wavelength shift and the sensitivity to the wavelength shift is increased as compared with providing the transmission of the desired wavelength at a maximum or minimum. While the etalon formed by the reflective portions 28 may be designed to provide any transmission to the desired wavelength, care must be taken to insure that this point is sufficiently removed from any flat portions of the response curve of the etalon such that the maximum desired deviation from the desired wavelength remains discernable. How rapidly the irradiance drops off on either side of the maximum is determined by the reflection coefficient of the reflective portions 28, with the drop off increasing with increasing reflectivity.

An alternative embodiment is shown in FIG. 2. Here, instead of a separate spacer 16, the substrate 12 with the aperture 10 therein also includes a recess 11 in which the photodetectors 14, 15 are mounted. Otherwise, the elements are the same as shown in FIGS. 1A–1E.

Figure 3:
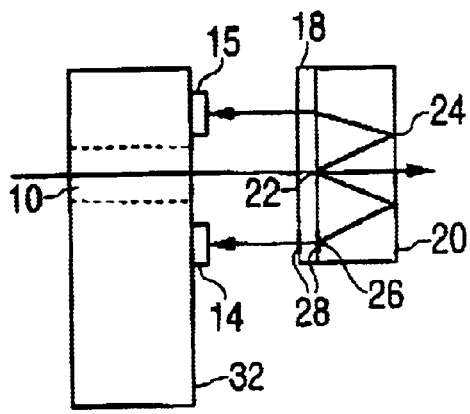
FIG. 3 is a schematic front view of another embodiment of the integrated wavelength locker of the present invention.

As shown in FIG. 3, rather than having a fully integrated system, the photodetectors 14 may be mounted to another substrate 32. In another embodiment shown in FIG. 4, the photodetectors 14 may be placed downstream of the optics block, requiring the use of additional reflective portions 36 on the optics block 20. This additional reflection allows the separation between the beams to become larger, reducing the likelihood the monitor beams will interfere with the application beam. Further, the attendant separation between the detectors 14, 15 allows the area there between to be used for other elements, such as electronics.

Figure 5:
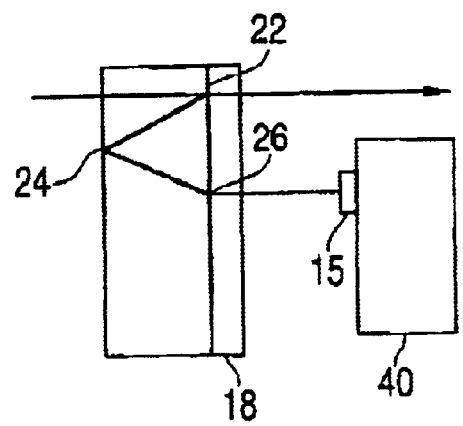
FIG. 5 is a schematic front view of another embodiment of the integrated wavelength locker of the present invention.

While the above embodiments have assumed a hole or aperture 10 is needed through the substrate on which the photodetectors 14, 15 are mounted, this substrate could also be transparent, e.g., a silicon substrate. However, it is often desirable to have the hole 10 therein, since if the light is incident on the substrate at an angle, the beam shift will be exaggerated if through the substrate rather than through the hole 10. One embodiment which eliminates the need for either a hole or a transparent substrate is shown in FIG. 5. Instead of a substrate which extends in the path of the application beam, both diffracted paths are deflected orthogonally to the application beam path, with the reference photodetector 15 being mounted on the substrate 40 behind the monitor photodetector 14 shown in FIG. 5.

While the above configurations have been for wavelength lockers in the primary path of an application light beam, e.g., for edge emitting light sources with insufficient light output from a back facet thereof or for surface emitting light sources, the wavelength locker of the present invention may also be used when the beam is not to be further employed, e.g., from the back facet of an edge emitting light source. In this scenario, the light is just directed through the etalon to the detectors, without having to worry about the beam proceeding onto the application.

Figure 4:
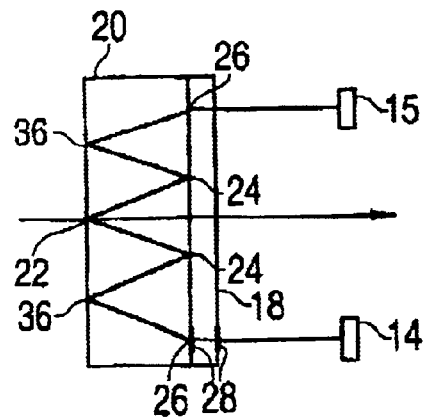
FIG. 4 is a schematic front view of another embodiment of the integrated wavelength locker of the present invention.
Figure 6A:
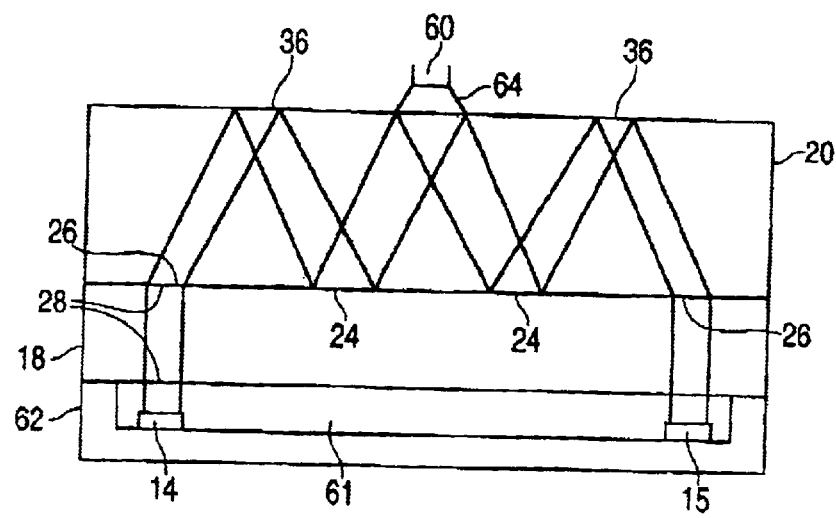

The configuration shown in FIG. 6A is similar to the one in FIG. 4, in which there are multiple reflections involved, allowing the beams on detectors 14, 15 to be larger. In FIG. 6A, the light output from a light source 60 is diverging, so an optical element 64 on the optics block 20 both collimates the light and directs the light to the reflective portions 24, which in turn direct the light to the mirror 36. The optical element 64 may be a diffractive element or a refractive/diffractive hybrid element. The light reflected from the mirrors 36 is incident on the optical elements 26, which collimate the light and direct it to the etalon block 18. The detectors 14, 15 may be mounted on a substrate 62 including a recess 61 in which the photodetectors 14, 15 are mounted. Since the light is input to the optics block 20 rather than the substrate 62, there is no need for an aperture in the substrate 62.

Figure 6B:
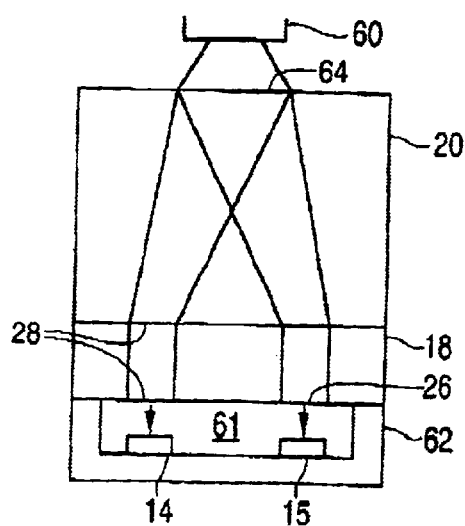
Figure 6C:
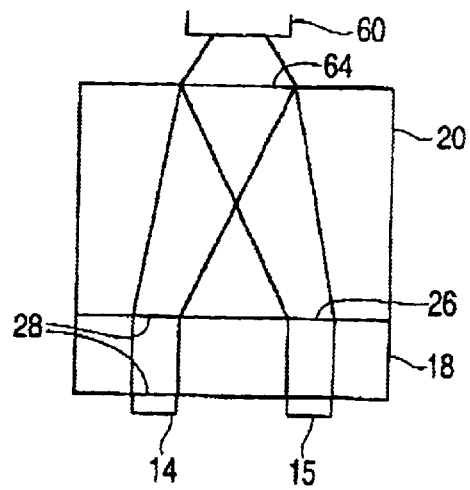

In FIG. 6B, no mirrors are employed, rather the diffractive element 64 collimates and directs the light from the light source 60 to the optical elements 26. In FIG. 6C, the configuration of the optical elements is the same as FIG. 6B, but the photodetectors 14, 15 are mounted directly on the bottom of the etalon block 18. While all the configurations in FIGS. 6A–6C have assumed the beam from the light source 60 is uncollimated, the beam may be collimated before being incident on the optical element 64, in which case the optical element 64 only needs to diffract the beam, as did previous element 22. Of course, element 22 could also collimate and/or focus the input beam if required.

All of the above configurations have illustrated the etalon block 18 as a solid block with appropriately positioned opposing reflective portions 28 on opposite surfaces thereof. However, this configuration may not provide a desired level of thermal stability, due to the coefficient of thermal expansion of the material of the block and/or any change in refractive index of the material with temperature, either of which may result in an change in optical path length between the opposing reflective portions 28 of the etalon block 18 with temperature, affecting the performance of the etalon 18. Of course, an appropriate material with a sufficient low coefficient of thermal expansions and a low change in refractive index, or two or more compensating materials may be used to form the solid etalon having good thermal stability.

One embodiment of an integrated wavelength locker having thermal stability is shown in FIG. 7A. The etalon block 18 is replaced with an etalon structure 70 including opposing reflection blocks 76 separated by spacers 74. Again, opposing reflective portions 28 are provided in the path of the first photodetector 14, but not the second reference photodetector 15. A reflective portion 28 is provided on each of the opposing faces of the reflection blocks 76. A gap 72 is created between the reflection blocks 76. The gap 72 may be evacuated, filled with air or any other appropriate medium. The presence of the gap 72 would allow the operating wavelength of the etalon to be altered in accordance with a medium therein if required. The material in the gap 72 should present as low a coefficient of thermal expansion as practical, so changes in temperature will not strongly affect the apparent separation between the opposing reflective portions 28. The spacers 74 are preferably made of material having a low coefficient of thermal expansion. In this particular configuration, an additional optics block 80 having the diffractive element 22 formed thereon is provided between the etalon structure 70 and the optics block 20.

An alternative embodiment for providing a thermally stable etalon structure 70 is shown in FIG. 7B. Here, the opposing reflection blocks 76 are made of a material having a greater coefficient of thermal expansion than the spacers 74. The opposing reflection blocks 76 also extend beyond the spacers 74 into the gap 72. The length of the gap is the difference between the overall length $L_2$ of the spacer 74 and the overlap length $L_1$ between the spacer 74 and the reflection block 76. The change 8 in length for each portion creating the gap is:

$$\delta_1 = \alpha_1 L_1 \Delta T$$

$$\delta_2 = \alpha_2 L_2 \Delta T \qquad (3)$$

where $\alpha$ is the respective coefficient of thermal expansion and $\Delta T$ is the change in temperature. The change in length of the gap $\delta_{gap}$ is given by:

$$\delta_{gap} = \delta_2 - \delta_1 \qquad (4)$$

Setting $\delta_{gap}$ to be zero, $\delta_2 = \delta_1$. Therefore, the respective lengths $L_1$ and $L_2$ are chosen such that:

$$\alpha_1 L_1 = \alpha_2 L_2 \qquad (5)$$

While only the etalon itself of the etalon structure 70 is shown in FIG. 7B, either the same elements without the reflective portions 28 are provided in the path of the reference photodetector 15 or the protruding portions of the reflection blocks 76 extend across both photodetectors 14, 15, with the spacers 74 on the periphery thereof as shown in FIG. 7A.

While all of the above configurations have assumed that the etalon was only in the path of the first detector, an etalon may be in the path of both detectors, as long as the optical path length of each etalon is different. This difference in optical path length may be realized in a number of ways by altering any of the variables set forth in equations (1) and (2) describing the operation of an etalon, e.g., changing the input angle, the reflectivity, the actual separation, et c. When the etalon is to be provided in the path of both detectors, and the main beam is not to pass through the substrate on which the etalon is provided, the reflective portions 28 may be provided across the entire substrate. Further, while only two photodetectors are illustrated, a plurality of photodetectors may be used, either all having etalons with different input angles or one of the plurality having no etalon in the path to serve purely as a reference. Further, the beams to be directed to the photodetectors do not have to have equal intensities, as long as the expected ratio there between is known.

Additionally, while all of the configurations shown illustrate the beam as being completely collimated, it does not have to be completely collimated. The beam only needs to be sufficiently collimated for enough intensity of the beam to be incident on the photodetector to insure detection.

In all of the configurations, the integrated wavelength locker is preferably formed on a wafer level, as set forth, for example, in commonly assigned, co-pending application Ser. No. 08/943,274, allowed, entitled "Wafer Level Integration of Multiple Optical Elements" which is hereby incorporated by reference in its entirety for all purposes. Preferably, a plurality of all the elements of the wavelength locker are bonded together at the wafer level and then diced to create the individual wavelength lockers. The material for the reflective portions 28 is also preferably selectively deposited on a wafer level. Apertures for either the holes or spacers may also be formed on the wafer level.

Since the polarization of the light output by the light source may vary as well as the wavelength, it is advantageous to employ a polarization insensitive grating as the diffractive grating 22, so that variations in polarization will not affect the measured wavelength variation intensity. Such a polarization insensitive grating is shown in FIG. 8.

In order to achieve a desired intensity output ratio between the amount of light being diffracted into the first order and the amount of light remaining in the zero order which is independent of input beam polarization state, an etch depth of the grating and a duty cycle of the grating are varied. First, the duty cycle value is varied from its value for the desired ratio at unpolarized light until the desired ratio was realized for a first polarization, e.g., TE. At this point, the ratio for a second, orthogonal polarization, e.g., TM, is not equal the desired polarization. Then, the etch depth is varied until the ratio for the second polarization is the desired ratio. This will result in changing the ratio of the first polarization from the desired ratio. Then the duty cycle is again adjusted, and then the etch depth is again adjusted. This process is repeated until a desired level of agreement between the ratios for both polarizations is achieved. While only one parameter is to be varied when adjusting the ratio for each polarization, it does not matter which parameter is adjusted for which polarization. An example of a single period of a one-dimensional grating realized after the iterative process noted above is shown in FIG. 8.

While the present invention is described herein with reference to illustrative embodiments for particular applications, it should be understood that the present invention is not limited thereto. Those having ordinary skill in the art and access to the teachings provided herein will recognize additional modifications, applications, and embodiments within the scope thereof and additional fields in which the invention would be of significant utility without undue experimentation. Thus, the scope of the invention should be determined by the appended claims and their legal equivalents, rather than by the examples given.

What is claimed is:

1. A wavelength locker comprising:
   a divider outputting at least a first beam, a second beam, and a third beam from an input beam from a light source;
   a first photodetector receiving the first beam;

a second photodetector receiving the second beam;

an etalon in a path between the divider and the first photodetector;

another element performing an optical function on at least one of the first, second and third beams; and a connector supplying outputs of the first photodetector and the second photodetector to a wavelength controller of the light source, wherein the third beam traverses the wavelength locker to a further application.

2. The wavelength locker of claim 1, wherein the divider includes a diffractive grating for deflecting a portion of the input beam into higher orders.

3. The wavelength locker of claim 2, wherein the diffractive grating is polarization insensitive.

4. The wavelength locker of claim 1, further comprising an optics block which directs the first and second beams to the first photodiode and the second photodiode, respectively.

5. The wavelength locker of claim 4, wherein the divider is integrated on the optics block.

6. The wavelength locker of claim 4, wherein the optics block provides at least one of collimating and focusing to at least one of the input beam, the first beam and the second beam.

7. The wavelength locker of claim 1, further comprising a substrate on which the first photodetector and the second photodetector are mounted.

8. The wavelength locker of claim 7, wherein the substrate has a hole therein between the first photodetector and the second photodetector.

9. The wavelength locker of claim 7, wherein the substrate has a transparent region therein between the first photodetector and the second photodetector.

10. The wavelength locker of claim 7, further comprising a spacer between the substrate and the etalon.

11. The wavelength locker of claim 7, wherein said substrate has a recess therein in which the first photodetector and the second photodetector are mounted.

12. The wavelength locker of claim 1, wherein the another element performing an optical function at least one of a refractive element and a diffractive element.

13. The wavelength locker of claim 4, wherein the optics block reflects the first and second beams to the first photodetector and the second photodetector, respectively.

14. The wavelength locker of claim 13, wherein the optics block provides multiple reflections to the first and second beams to direct them to the first photodetector and the second photodetector, respectively.

15. The wavelength locker of claim 1, wherein the etalon is solid.

16. The wavelength locker of claim 1, wherein the etalon has a gap between opposing reflective portions thereof.

17. The wavelength locker of claim 1, wherein the another element performing an optical function is another etalon in a path between the divider and the second photodetector, the another etalon having a different path length than the etalon between the divider and the first photodetector.

18. The wavelength locker of claim 4, wherein the another element performing an optical function is on the optics block.

19. A wavelength monitor comprising:

a first substrate being optically transparent and having first and second opposing parallel faces;

at least two photodetectors;

a splitting element which creates at least two light beams from an input beam;

a directing element which directs each of said at least two light beams onto a respective photodetector; and an etalon in the path of at least one of said at least two photodetectors, the etalon and the first substrate being secured together, wherein said splitting element and said directing element are on at least one of said first and second opposing parallel faces of the first substrate and parallel faces of any structure secured to at least one of said first substrate and said etalon.

20. An etalon block comprising:

a continuous substrate which is to extend across at least two photodetectors; and at least two opposing reflective portions on the substrate in a path of at least one of said at least two photodetectors, said two opposing reflective portions forming an etalon, with at least one of said at least two photodetectors not having reflective portions in a path thereof, wherein said continuous substrate includes two continuous substrates and a spacer bonded to the two continuous substrates, forming a gap between the two continuous substrates, said at least two opposing reflective portions being on opposing faces of said two continuous substrates.

21. The etalon block of claim 20, wherein said at least two opposing reflective portions are formed on a wafer.

22. An etalon block comprising:

a substrate having two opposing parallel surfaces, reflective coatings on each of the two opposing parallel surfaces, the reflective coatings forming an etalon, and another element performing another optical function on at least one of the two opposing parallel surfaces; and an optics block adjacent to said substrate, at least one of said optics block and said substrate including a divider for creating at least a first beam and a second beam from an input beam from a light source, the first beam passing through the etalon and at least one of the second beam and the input beam passing through the other optical element.

23. The etalon block of claim 22, wherein the other optical element is another etalon, separate from said etalon, the second beam passing through the another etalon, the another etalon having a different optical path length than said etalon.

24. The etalon block of claim 22, wherein the another optical element is a divider for creating at least a first beam and a second beam from an input beam from a light source.

25. A wavelength locker comprising:

a divider creating at least a first beam and a second beam from an input beam from a light source;

a first photodetector receiving the monitor beam;

a second photodetector receiving the reference beam;

an etalon in a path between the divider and the monitor photodetector;

an optics block having an optical element thereon; and a connector supplying outputs of the monitor photodetector and the reference photodetector to a wavelength controller of the light source, wherein the etalon, the divider and the optical element are formed on surfaces that are parallel to one another.

26. The wavelength locker of claim 25, wherein the divider creates a third beam, the third beam traversing the wavelength locker and output to another application.

27. The wavelength locker of claim 25, wherein the divider is a diffractive optical element.

28. The wavelength monitor of claim 19, wherein an element creating the at least two beams from an input beam further outputs a third beam to traverse the wavelength monitor and proceed to a further application.

* * * * *